United States Patent
Matsushita et al.

(10) Patent No.: US 7,763,869 B2
(45) Date of Patent: Jul. 27, 2010

(54) UV LIGHT IRRADIATING APPARATUS WITH LIQUID FILTER

(75) Inventors: Kiyohiro Matsushita, Tama (JP); Kenichi Kagami, Tama (JP)

(73) Assignee: ASM Japan K.K., Tokyo (JP)

(*) Notice: Subject to any disclaimer, the term of this patent is extended or adjusted under 35 U.S.C. 154(b) by 333 days.

(21) Appl. No.: 11/690,614

(22) Filed: Mar. 23, 2007

(65) Prior Publication Data

US 2008/0230721 A1    Sep. 25, 2008

(51) Int. Cl.
G21K 5/02    (2006.01)
(52) U.S. Cl. ............... 250/504 R; 250/492.1; 250/492.2; 438/795; 438/798; 359/350; 359/358; 359/359
(58) Field of Classification Search ............ 250/493.1, 250/504 R, 505.1, 492.1, 492.2, 494.1, 432 R, 250/435, 436, 492.3, 496.1, 503.1, 428, 433, 250/434, 437; 438/7, 16, 29, 795, 798; 422/105, 422/186.3, 187, 300; 430/5, 30, 495.1; 264/494, 264/455, 458, 459, 480, 481, 405, 479, 492, 264/493; 362/22, 230, 234; 359/308, 339, 359/350, 358, 359
See application file for complete search history.

(56) References Cited

U.S. PATENT DOCUMENTS

| | | | |
|---|---|---|---|
| 3,783,276 A * | 1/1974 | Allington | 250/226 |
| 5,425,848 A * | 6/1995 | Haisma et al. | 216/48 |
| 5,942,109 A * | 8/1999 | Wuebker et al. | 210/198.1 |
| 6,296,909 B1 | 10/2001 | Spitsberg et al. | |
| 6,420,036 B1 | 7/2002 | Varaprasad et al. | |
| 6,646,278 B1 * | 11/2003 | Schwarz et al. | 250/504 R |
| 6,759,098 B2 | 7/2004 | Han et al. | |
| 6,932,903 B2 * | 8/2005 | Chang | 210/192 |
| 6,941,063 B2 * | 9/2005 | Camm et al. | 392/416 |
| 7,070,106 B2 | 7/2006 | Knowles et al. | |
| 7,098,149 B2 | 8/2006 | Lukas et al. | |
| 2003/0087107 A1 | 5/2003 | Varaprasad et al. | |
| 2005/0024459 A1 * | 2/2005 | Codos | 347/102 |
| 2006/0286306 A1 | 12/2006 | Ohara et al. | |

(Continued)

FOREIGN PATENT DOCUMENTS

JP    58-55038    4/1983

(Continued)

OTHER PUBLICATIONS

Matsuhita et al., Method for Managing UV Irradiation for Curing Semiconductor Substrate, U.S. Appl. No. 11/780,021, filed Jul. 19, 2007.

*Primary Examiner*—Jack I Berman
*Assistant Examiner*—Nicole Ippolito Rausch
(74) *Attorney, Agent, or Firm*—Knobbe, Martens, Olson & Bear LLP

(57) ABSTRACT

A UV light irradiating apparatus for irradiating a semiconductor substrate with UV light includes: a reactor in which a substrate-supporting table is provided; a UV light irradiation unit connected to the reactor for irradiating a semiconductor substrate placed on the substrate-supporting table with UV light through a light transmission window; and a liquid layer forming channel disposed between the light transmission window and at least one UV lamp for forming a liquid layer through which the UV light is transmitted. The liquid layer is formed by a liquid flowing through the liquid layer forming channel.

14 Claims, 7 Drawing Sheets

U.S. PATENT DOCUMENTS

| | | | |
|---|---|---|---|
| 2007/0228289 A1* | 10/2007 | Kaszuba et al. | 250/492.1 |
| 2007/0242247 A1* | 10/2007 | Shiraishi | 355/53 |
| 2007/0252961 A1* | 11/2007 | Novak et al. | 355/30 |
| 2007/0295355 A1* | 12/2007 | Ikuta | 134/1 |
| 2008/0220619 A1 | 9/2008 | Matsuhita et al. | |

FOREIGN PATENT DOCUMENTS

WO  PCT/JP2005/011375  * 12/2005

* cited by examiner

UV LIGHT IRRADIATING APPARATUS WITH LIQUID FILTER

BACKGROUND OF THE INVENTION

1. Field of the Invention

The present invention generally relates to a UV light irradiating apparatus or a method for irradiating a semiconductor substrate.

2. Description of the Related Art

Traditionally, UV processing apparatuses have been used in the reforming of various processing targets using ultraviolet light or in the production of substances through processes that utilize photochemical reactions. The trend of increasingly integrated devices in recent years has created needs for refined wiring designs and multi-layer wiring structures, which has made it vital to reduce inter-layer volumes to increase the processing speeds of devices while reducing their power consumptions. Low-k (low-dielectric-constant film) materials are used to reduce inter-layer volumes. However, reducing the dielectric constant of a material also reduces its mechanical strength (elastic modulus, or EM), which makes it difficult for the low-k material to withstand the stresses received in subsequent processes such as CMP, wire bonding and packaging. One method to address the aforementioned problem is to cure the low-k material with UV irradiation to improve its mechanical strength (examples are found in U.S. Pat. No. 6,759,098 and U.S. Pat. No. 6,296,909). UV irradiation causes the low-k material to shrink and harden, thereby increasing its mechanical strength (EM) by 50 to 200%. Separately, optical CVD based on photochemical reaction has been studied for years as a way to respond to another demand stemming from the recent trend of highly integrated devices, which is to obtain various thin films free from heat or plasma damages by utilizing thermal CVD or PECVD-based film deposition processes.

SUMMARY OF THE INVENTION

UV irradiation has the effect of enhancing the mechanical strength of a low-k film by breaking the —CH3 bond or —Si—O bond in film and then re-bonding the broken components to build an O—Si—O network. This effect is stronger with UV light with short wavelengths because such light generates higher energy. Various types of lamps can be used for UV curing, such as excimer lamps and mercury lamps. Among these, mercury lamps produce light of various wavelengths and generate a lot of heat as a result, and therefore these lamps require cooling. Normally mercury lamps are cooled by a blower supplying cooling air. Since the oxygen in cooling air absorbs UV light with a wavelength of 250 nm or shorter and converts it to ozone, however, the quantity of effective UV light reaching the irradiation target will decrease. As a result, the curing efficiency will drop and the throughput will also be affected. Furthermore, generated ozone is harmful and thus the exhaust gas must be treated with a scrubber method, etc. If the input power to the lamp is increased in an attempt to increase the quantity of effective UV light with a wavelength of 250 nm or shorter, more heat will generate and the temperature of the curing target, i.e., the substrate on which a low-k film has been deposited, will also increase. Accordingly, there is a limit to how much the input power can be increased.

To solve at least one of the aforementioned problems, an embodiment of the present invention changes the lamp cooling method from air-cooling to water-cooling. Since this eliminates the need for use of atmospheric air for cooling, the required UV light with a wavelength of 250 nm or shorter will not be absorbed by the oxygen in cooling air, which in turn enables effective UV processing. UV light with a wavelength of 250 nm or shorter is effective in curing low-k films. In particular, UV light with a wavelength in a range of 200 to 250 nm is very effective. A lot of air is needed to cool mercury lamps, but as noted above, effective light with a wavelength of 250 nm or shorter is absorbed by the oxygen in air and converted to harmful ozone. Use of nitrogen is not practical in view of the large quantity of nitrogen required. These concerns will no longer be necessary if the aforementioned embodiment is used. In another embodiment, the atmosphere in the lamp unit is replaced with N2 to prevent UV light with a wavelength of 250 nm or shorter from being absorbed by the oxygen in cooling air. Another problem, as mentioned before, is that if the intensity of UV light with a wavelength of 250 nm or shorter is raised to improve the curing efficiency, the greater heat generated from the lamp will increase the temperature of the irradiated substrate. Consequently, the intensity of UV light can only be increased to a certain level. In an embodiment, a water-cooled lamp is used to increase the intensity of UV light without causing problems associated with heat.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
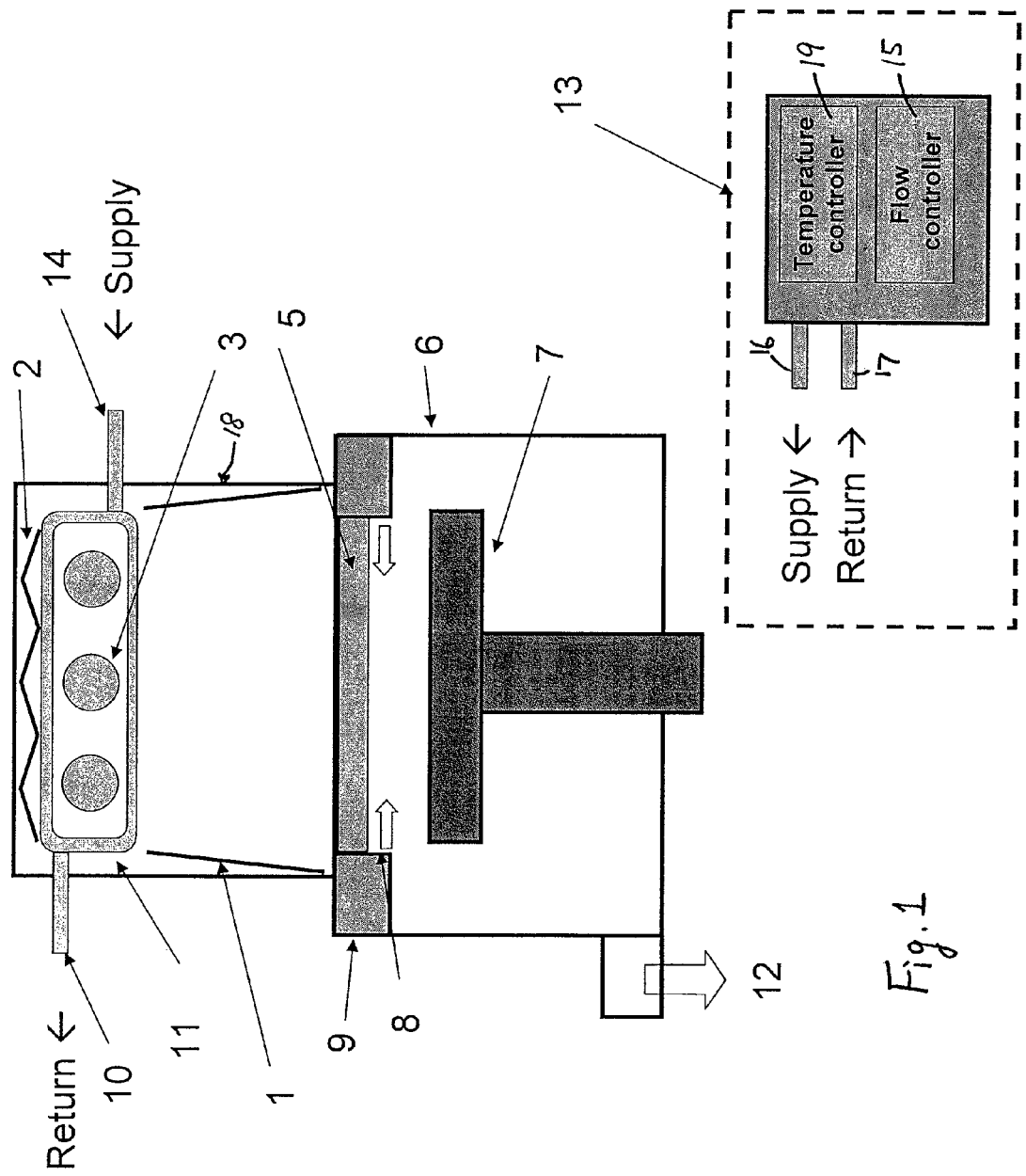
FIG. 1 is a schematic diagram of a UV irradiation apparatus according to an embodiment of the present invention.

The present invention will be explained with reference to preferred embodiments. However, the preferred embodiments are not intended to limit the present invention.

In an embodiment, the present invention provides a UV light irradiating apparatus for irradiating a semiconductor substrate with UV light, comprising: (i) a reactor in which a substrate-supporting table is provided, said reactor being provided with a light transmission window; (ii) a UV light irradiation unit connected to the reactor for irradiating a semiconductor substrate placed on the substrate-supporting table with UV light through the light transmission window, said UV light irradiation unit including at least one UV lamp; and (iii) a liquid layer forming channel disposed between the light transmission window and the UV lamp for forming a liquid layer through which the UV light is transmitted, said liquid layer being formed by a liquid flowing through the liquid layer forming channel.

The above embodiment may further include, but may not be limited to, the following embodiments:

In an embodiment, the liquid layer may be formed by the flowing liquid which has substantially or nearly no absorption of UV light having a wavelength of 250 nm or lower. In an embodiment, the liquid constituting the liquid layer may be water. In an embodiment, the liquid layer forming channel may be formed with a glass capable of transmitting UV light having a wavelength of 250 nm or lower.

In an embodiment, the liquid layer forming channel may be formed by two transparent walls for passing the liquid therebetween. In a preferred embodiment, a distance between the two walls may be about 5 mm to about 15 mm (preferably 7 mm to 12 mm). The thickness of the wall (e.g., made of a quartz glass) may be about 1 mm to about 2 mm.

In an embodiment, the liquid layer forming channel may be formed by a double walled enclosure comprising an inner wall and an outer wall for passing the liquid between the walls, said enclosure enclosing the UV lamp. In an embodiment, the UV lamp may have an elongated shape. In an embodiment, the double walled enclosure may have a liquid inlet port for introducing the liquid between the inner and outer walls and a liquid outlet port for discharging the liquid from between the inner and outer walls. In an embodiment, the double walled enclosure may have an inert gas inlet port for introducing inert gas into an interior enclosed by the inner wall and an inert gas outlet port for discharging the inert gas from the interior.

In an embodiment, the liquid layer forming channel may be disposed in parallel to and closer to the UV light transmission window than to the UV lamp. In an embodiment, the UV light transmission window may constitute the liquid layer forming channel.

In an embodiment, the UV irradiation unit may be provided with a reflection plate disposed along an inner wall of the UV irradiation unit, said reflection plate being angled to reflect UV light from the UV lamp toward the UV light transmission window.

In an embodiment, the liquid layer forming channel may have a liquid inlet port for introducing the liquid into the channel and a liquid outlet port for discharging the liquid from the channel and may be provided with a temperature sensor disposed at the liquid outlet port for detecting a temperature of the liquid at the liquid outlet port. In an embodiment, the liquid layer forming channel may be provided with a flow controller disposed upstream of the liquid inlet port for controlling the liquid flow according to the temperature detected by the temperature sensor.

In another embodiment, the present invention provides a method for irradiating a semiconductor substrate with UV light, comprising: (i) placing a semiconductor substrate on a substrate-supporting table in a reactor; (ii) forming a liquid layer by passing a liquid through a liquid layer forming channel disposed between a UV lamp provided in a UV light irradiation unit and a light transmission window provided between the reactor and the UV light irradiation unit; and (iii) irradiating the semiconductor substrate with UV light emitted from the UV lamp through the liquid layer and the light transmission window.

The above embodiment may further include, but may not be limited to, the following embodiments:

In an embodiment, the liquid layer may be formed by passing the liquid which has substantially or nearly no absorption of UV light having a wavelength of 250 nm or lower. In an embodiment, the liquid constituting the liquid layer may be water. In an embodiment, the substrate may have a low-k film (or ultra low-k film) subjected to the UV light irradiation.

In an embodiment, the liquid layer forming channel may be formed by a double walled enclosure which encloses the UV lamp and may comprise an inner wall and an outer wall, wherein the liquid layer forming step comprises passing the liquid between the inner and outer walls. In an embodiment, the liquid layer forming step may further comprise introducing inert gas into an interior enclosed by the inner wall and discharging the inert gas from the interior.

In an embodiment, the liquid layer may be formed in parallel to and closer to the UV light transmission window than to the UV lamp. In an embodiment, the UV light transmission window may serve as the liquid layer forming channel, and the liquid layer may be formed in the UV light transmission window.

In an embodiment, the UV irradiation unit may be provided with a reflection plate disposed along an inner wall of the UV irradiation unit, wherein the irradiation step may further comprise reflecting UV light from the UV lamp using the reflection plate toward the UV light transmission window.

In an embodiment, the liquid layer forming step may comprise introducing the liquid into the channel, discharging the liquid from the channel, detecting a temperature of the liquid discharging from the channel, and controlling the flow of the liquid introduced into the channel according to the detected temperature. In an embodiment, the liquid flow may be controlled to control the temperature of the liquid discharging from the channel at 40° C. or lower.

The present invention will be explained in detail below with reference to preferred embodiments and drawings. The preferred embodiments and drawings are not intended to limit the present invention.

In all of the aforesaid embodiments, any element used in an embodiment can interchangeably be used in another embodiment unless such a replacement is not feasible or causes adverse effect. Further, the present invention can equally be applied to apparatuses and methods.

The UV irradiation apparatus shown in FIG. 1 comprises a UV unit 18, water-cooled filter 11, irradiation window 5, gas introduction ring 9, reactor chamber 6, heater table 7, and vacuum pump 12. The gas introduction ring 9 has multiple gas outlet ports 8, through which gas is discharged toward the center between the arrows. A cold mirror 1 is fitted along the interior walls of the UV unit 18 to transmit IR light but cause UV light to reflect upon the mirror, so that UV light will go through the irradiation window 5 effectively. Another cold mirror 2 is also placed above a UV lamp 3 for the same purpose. The water-cooled filter 11 has a cooling-water inlet 14 and cooling-water outlet 10, where the cooling-water inlet 14 is connected to a cooling-water supply port 16 on a chiller unit (heat exchanger) 13 to allow cooling water in the chiller unit 13 to be supplied into the water-cooled filter 11. The cooling-water outlet 10 is connected to a cooling-water return port 17 on the chiller unit 13 to return cooling water to the chiller unit 13 after it has passed through the water-cooled filter 11. The chiller unit 13 has a temperature controller 19 and a flow controller 15 to control the temperature and flow rate of cooling water.

The UV irradiation apparatus is not limited to the one illustrated in this figure, and any apparatus can be used as long as it can irradiate UV light. However, the following explanation applies to the structure of the apparatus shown in this figure. In this figure, the chamber 6 can be controlled at various conditions between vacuum and near atmosphere, and the UV irradiation unit 18 is placed on top. In this figure, the UV light source 3 and heater 7 are opposingly positioned in parallel with each other, and the irradiation window glass 5 is opposingly positioned between the UV light source 3 and heater 7 in parallel with the two. The irradiation window 5 is used to irradiate uniform UV light, and made of synthetic quartz, for example. This window can be made of any material, as long as it can shield the reactor 6 from atmosphere but allow UV light to transmit through. The UV light source 3 in the UV irradiation unit 18 has multiple tubes that are arranged in parallel with one another. As shown in FIG. 1, this light source is properly arranged to achieve uniform intensity, and a reflector 2 (which looks like a lamp shade of the UV lamp) is provided to allow UV light from each UV tube to be reflected toward the thin film, where the angle of the reflector 2 is adjustable to achieve uniform intensity. The lamp 3 is made of glass, such as synthetic quartz, that allows UV light to transmit through, and is positioned inside the unit 11 in which cooling water flows. Cooling water flowing through the unit 11 is circulated by the chiller unit 13 positioned outside the unit. The unit 11 is also filled with nitrogen to eliminate oxygen, so that ozone will not generate as a result of UV irradiation. In this apparatus, the substrate processing section 6 that can be controlled at various conditions between vacuum and near atmosphere is separated from the UV emitting section 18 by a flange 9 in which the irradiation window glass 5 is set. The space between the UV emitting section and irradiation window glass 5 has been replaced by nitrogen, which also serves to prevent absorption of UV light by the oxygen in air and consequent generation of ozone.

In this embodiment, the UV light source 3 is structured in such a way that it can be easily removed and replaced. Also in this embodiment, gas is introduced through the flange 9, where multiple gas inlet ports are provided and arranged symmetrically to create a uniform processing atmosphere. In the UV irradiation process, the chamber 6 is filled with gas selected from Ar, CO, CO2, C2H4, CH4, H2, He, Kr, Ne, N2, O2, Xe, alcohol gases, and organic gases, and its pressure is adjusted to a range of approx. 0.1 Torr to near atmosphere (including 1 Torr, 10 Torr, 50 Torr, 100 Torr, 1,000 Torr, and values between any two numbers of the foregoing), and then a processing target, or semiconductor substrate carried in through the substrate transfer port via the gate valve, is placed on the heater 7 whose temperature has been set to a range of approx. 0° C. to approx. 650° C. (including 10° C., 50° C., 100° C., 200° C., 300° C., 400° C., 500° C., 600° C., and values between any two numbers of the foregoing, but preferably in a range of 300° C. to 450° C.), after which UV light with a wavelength in a range of approx. 100 nm to approx. 400 nm (including 150 nm, 200 nm, 250 nm, 300 nm, 350 nm, and values between any two numbers of the foregoing, but preferably in a range of approx. 200 to 250 nm) is irradiated at an output in a range of approx. 1 mW/cm$^2$ to approx. 1,000 mW/cm$^2$ (including 10 mW/cm$^2$, 50 mW/cm$^2$, 100 mW/cm$^2$, 200 mW/cm$^2$, 500 mW/cm$^2$, 800 mW/cm$^2$, and values between any two numbers of the foregoing) onto the film on the semiconductor substrate by keeping an appropriate distance from the UV light source (the distance between the water-cooled filter 11 and irradiation window 5 may be approx. 5 to 40 cm, while the distance between the irradiation window 5 and substrate may be approx. 0.5 to 10 cm). Use of UV light with a wavelength of preferably 300 nm or shorter, or more preferably 250 nm or shorter, will maximize the effect of UV irradiation (such as curing of low-k film) while suppressing heat generation. The irradiation time may be in a range of approx. 1 sec to approx. 60 min (including 5 sec, 10 sec, 20 sec, 50 sec, 100 sec, 200 sec, 500 sec, 1,000 sec, and values between any two numbers of the foregoing). The chamber is evacuated via the exhaust port. This semiconductor manufacturing apparatus performs a series of processing steps according to an automatic sequence, where the specific processing steps include gas introduction, UV irradiation, stopping of irradiation, and stopping of gas supply.

Figure 2:
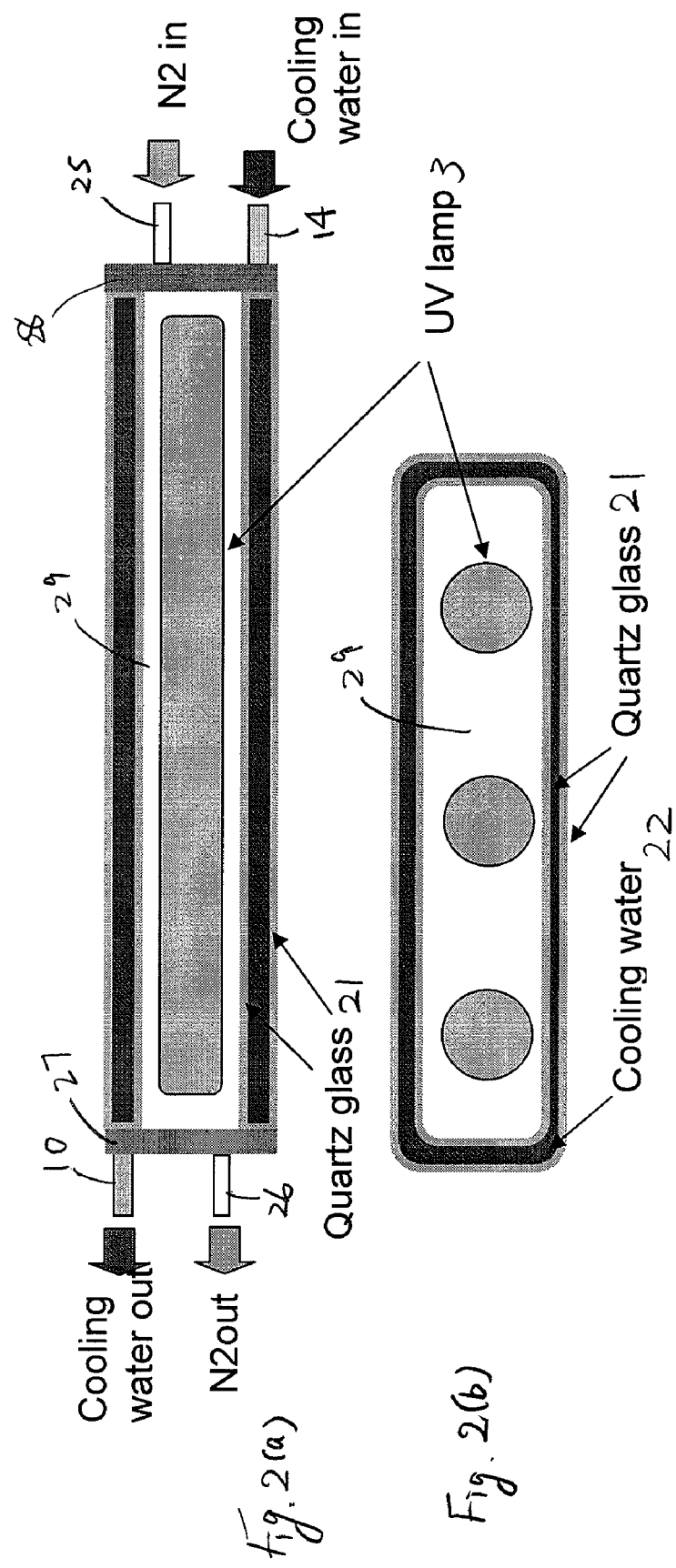
FIGS. 2(a) and 2(b) are respectively a schematic side view and a schematic front view of UV lamps enclosed by a liquid filter according to an embodiment of the present invention.

FIGS. 2(*a*) and 2(*b*) are a schematic side view and a schematic front view, respectively, of a water-cooled filter used in an embodiment. This water-cooled filter encloses the UV lamp 3, storing the vertically long UV lamp 3 and sealed by covers 27, 28 on both ends to create an interior space 29. One cover 28 has an inlet 25 through which to introduce an inert gas, such as nitrogen gas, into the interior space 29, while the other cover 27 has an exhaust port 26 through which to exhaust the inert gas after it has passed through the interior space 29. The covers 27, 28 need not hermetically seal the interior space 29 (because the interior will reach high temperatures), but instead it is sufficient for them to maintain the interior space 29 at a positive pressure to prevent entry of atmospheric air (oxygen). The covers 28, 27 also have a cooling-water inlet 14 through which to introduce cooling water, and a cooling-water outlet 10 through which to discharge cooling water, respectively. The water-cooled filter comprises double-walled quartz glass 21 with cooling water 22 flowing in between the walls. In an embodiment, the thickness of the quartz glass is approx. 1 to 2 mm, while the thickness of the water layer is approx. 5 to 15 mm.

In FIG. 2, the water-cooled filter surrounds three UV lamps. However, each UV lamp may be stored in a separate cylindrical water-cooled filter, or five to 10 UV lamps may be stored in a single water-cooled filter.

In an embodiment, the UV lamp generates light covering a wide wavelength range from DUV to infrared, and mercury lamps are particularly suited for this application. Mercury lamps are classified by the internal lamp pressure into various types from low-pressure to ultrahigh-pressure types associated with wavelengths of 185 nm, 254 nm, 365 nm, etc., and any type can be selected as deemed appropriate (light with a wavelength shorter than 300 nm is effective in curing low-k films). Mercury lamps break the —CH3 bond or —Si—O bond in a low-k film and then allow the broken components to re-bond to build an O—Si—O network to enhance the mechanical strength of the film. The atmosphere in which the substrate is kept is normally replaced with an inert gas to prevent oxidization of the low-k film. Normally N2, He, Ar, etc., is used as this inert gas. In an embodiment, KrCl excimer (222 nm) lamps may be used. KrCl excimer lamps are associated with relatively weak output, but they have a wavelength of 250 nm or shorter and can efficiently improve film quality.

Figure 3:
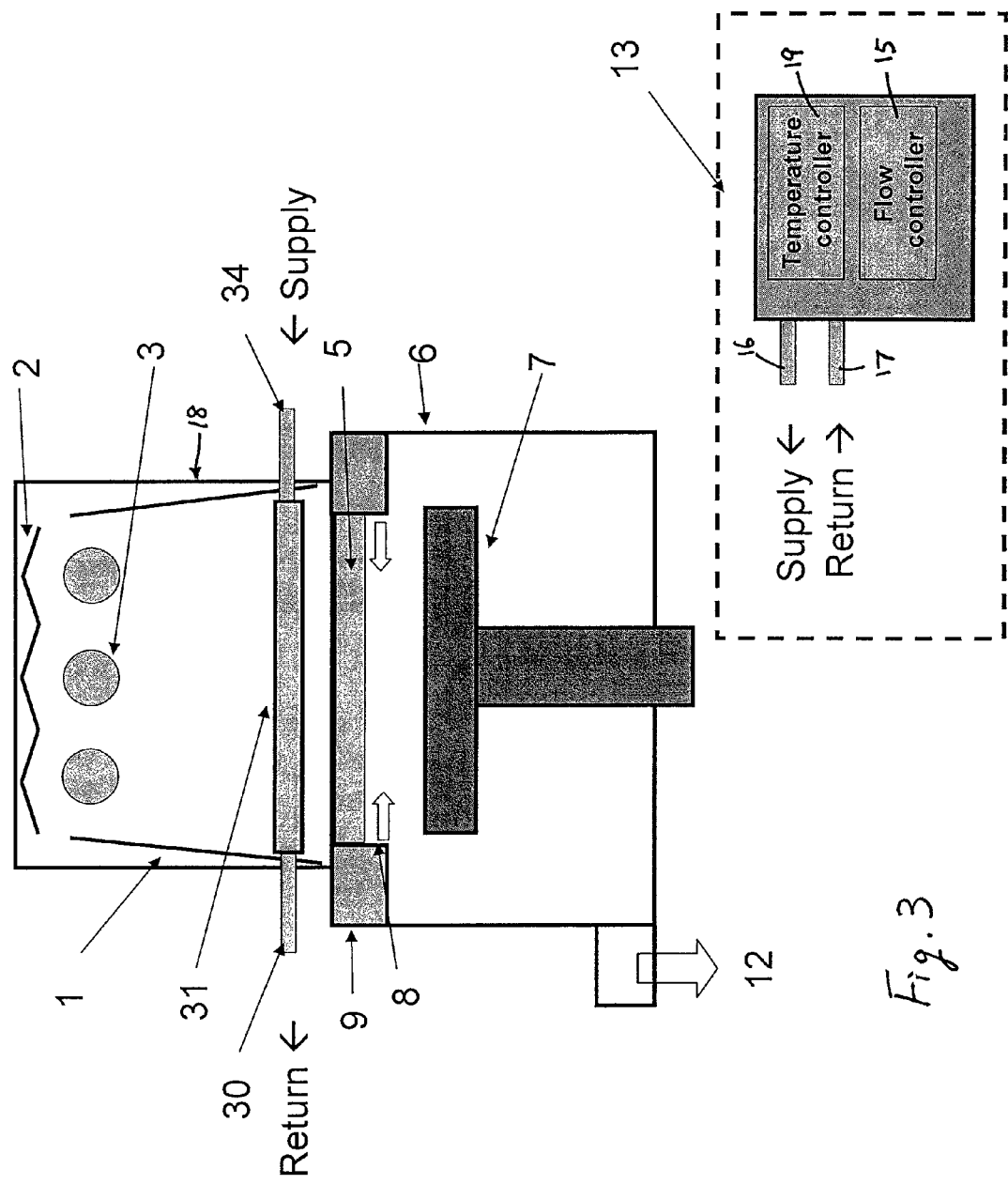
FIG. 3 is a schematic diagram of a UV irradiation apparatus according to an embodiment of the present invention.
Figures 4A, 4B:
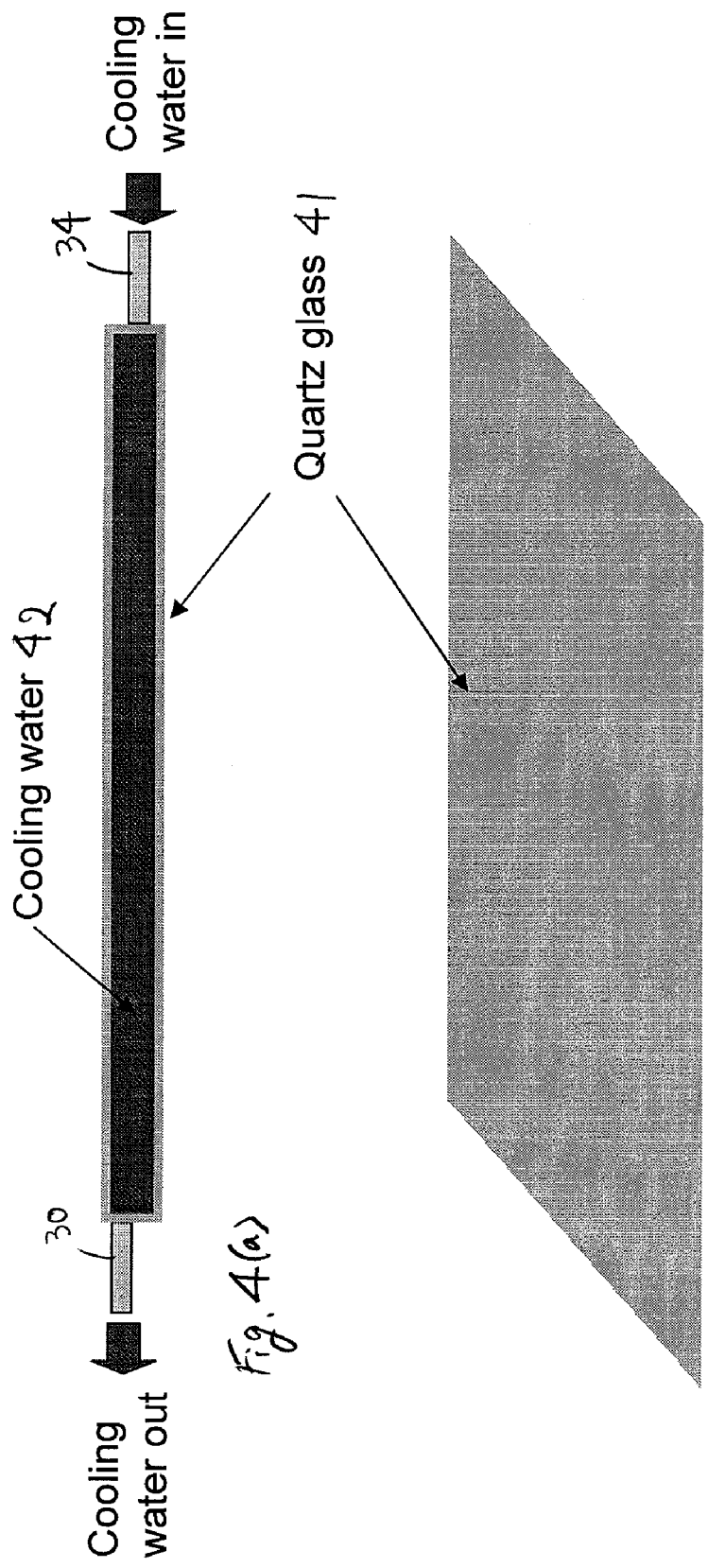
FIGS. 4(a) and 4(b) are respectively a schematic side view and a schematic perspective view of a liquid filter according to an embodiment of the present invention.

The water-cooled filter is not limited to the configuration illustrated in FIG. 1 and FIG. 2, and any other embodiment may be used such as one where a water layer is provided between the UV lamp and irradiation window. For example, an embodiment in which water flows between two glass sheets can be considered. FIG. 3 and FIG. 4 each shows a schematic diagram of a water-cooled filter 31 according to such embodiment. All other components of the structure can be the same as those shown in FIG. 1. Since the same reference numbers are used to indicate the same components, their explanation is omitted. In this embodiment, the entire surface of the irradiation window is covered with a filter glass made of synthetic glass, etc. The filter is filled with water, and this water is temperature-controlled by the chiller unit. As shown in FIG. 4, the water-cooled filter 31 basically comprises two synthetic quartz sheets 41 positioned with a specific distance kept in between (such as the same as or around 1.5 or 2 times the thickness of the water layer mentioned above), and is hermetically sealed, except that a cooling-water inlet 34 is provided on the right end and a cooling-water outlet 30 is provided on the left end so that cooling water 42 can flow inside. The water-cooled filter 31 is provided near the irradiation window 5, and in an embodiment the distance between the two is around several millimeters to several centimeters. It is also possible to have the irradiation window itself constituted by a water-cooled filter.

By using a water-cooled filter, heat from the UV lamp can be suppressed more effectively. Also, UV light with a wavelength of 250 nm or shorter effective in processing semiconductor films can be transmitted without absorption loss, and consequently semiconductor films can be processed effectively. Use of a cold filter comprising synthetic glass coated with an organic film, etc., is effective in cutting off heat. However, such a filter is not effective because it also absorbs light with a wavelength of 250 nm or shorter. In an embodiment of the present invention, no filter including a cold filter is used and water is used instead to shield heat. Water is known to absorb infrared with a long wavelength of 1 μm or longer, without absorbing any other light with a shorter wavelength. Since IR light with a wavelength of 1 μm or longer does not affect film quality, absorption of light in this wavelength range does not present problems. In an embodiment, the lamp is enclosed with a glass that transmits UV light with a wavelength of 250 nm or shorter, and then this glass is enclosed with another layer of glass. By filling the space between the two glass layers with water, a water filter is constituted. The double glass layers of this filter are fully sealed and do not leak water filled in between. Also, this filter is connected to the water-cooling unit installed externally to the UV irradiation unit to circulate the cooling water inside. In an embodiment, the filter is filled with an inert gas such as nitrogen, Ar, He, etc., and no oxygen exists that absorbs UV light with a wavelength of 250 nm or shorter. This filter resolves the heat problem, allowing the intensity of effective curing UV light with a wavelength of 250 nm or shorter to be raised without raising the substrate temperature. By the way, light with a wavelength of around 170 to 180 nm may break the Si—CH3 bond and thereby promote the formation of unnecessary bonds, such as the Si—H bond with H attached to a broken component of Si—CH3 bond. Accordingly, the key wavelength range of UV light may preferably be 200 to 250 nm, and UV light meeting this condition may be transmitted to the substrate.

Figure 5:
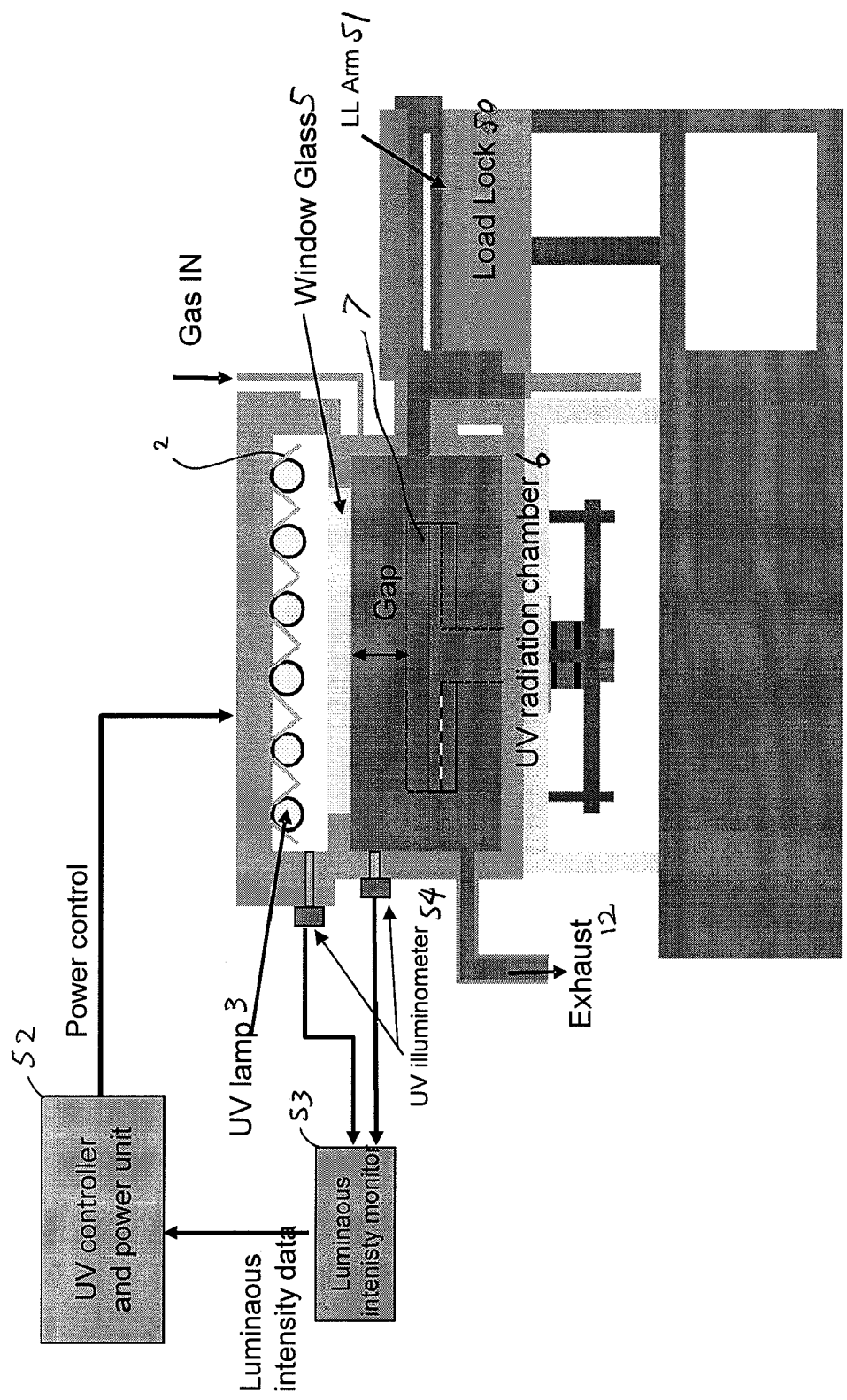
FIG. 5 is a schematic diagram of a UV irradiation apparatus according to an embodiment of the present invention.

To control the intensity of UV light, the method shown in FIG. 5 can be used, for example. The apparatus in FIG. 5 uses a UV illuminometer 54 to measure the intensity of UV light irradiated from the UV lamp 3 at positions before and after the irradiation window 5, and sends the results as signals to an intensity monitor 53, where the signals are recognized as intensity data and output to a UV controller/power unit 52 to control the power to the UV lamp 3. In this embodiment, the water-cooled filter is installed in the irradiation window 5. Also, a substrate to be placed inside the UV irradiation chamber 6 is transferred from a load lock chamber 50 into the UV irradiation chamber by means of a load lock arm (LL arm) 51 installed in the load lock chamber 50. Following the transfer of the substrate, the susceptor 7 in the UV irradiation chamber will rise to a position where a specified gap is achieved from the irradiation window.

In conventional apparatus where the lamp is cooled with a blower using atmospheric air, the lamp unit inevitably contained atmospheric air. Nitrogen or other gas can be used to cool the lamp to prevent absorption of UV light with a wavelength of 250 nm or shorter, but this is not practical from the cost-effectiveness viewpoint because a large quantity of gas will be required. Since use of a water-cooled filter eliminates the need for air cooling using a blower, the lamp unit can be always filled with nitrogen to remove oxygen.

In an embodiment, cooling water from the water-cooled filter uses pure water, ion exchanged water, etc., and its flow rate is controlled to achieve a temperature of approx. 25° C. at the inlet to the lamp (cooling-water inlet) and approx. 35 to 40° C. at the outlet (cooling-water outlet) so as to prevent the dissolved oxygen in cooling water from forming air bubbles to absorb/scatter UV light. As shown in FIG. 1 and FIG. 3, the chiller unit 13 has the temperature controller 19 and flow controller 15 for monitoring the temperature of cooling water (such as the outlet temperature) and adjusting the flow rate. If the outlet temperature of cooling water is high, the circulation rate is increased. If the temperature is low, the circulation rate is decreased. In an embodiment, the inlet temperature should be kept to around room temperature because if the inlet temperature is lower than room temperature, bedewing may occur. A desirable method to keep the temperature of cooling water at the outlet to 40° C. or below and thereby suppress formation of air bubbles, is to supply cooling water of room temperature into the filter by approx. 5 to 20 SLM.

Figure 6:
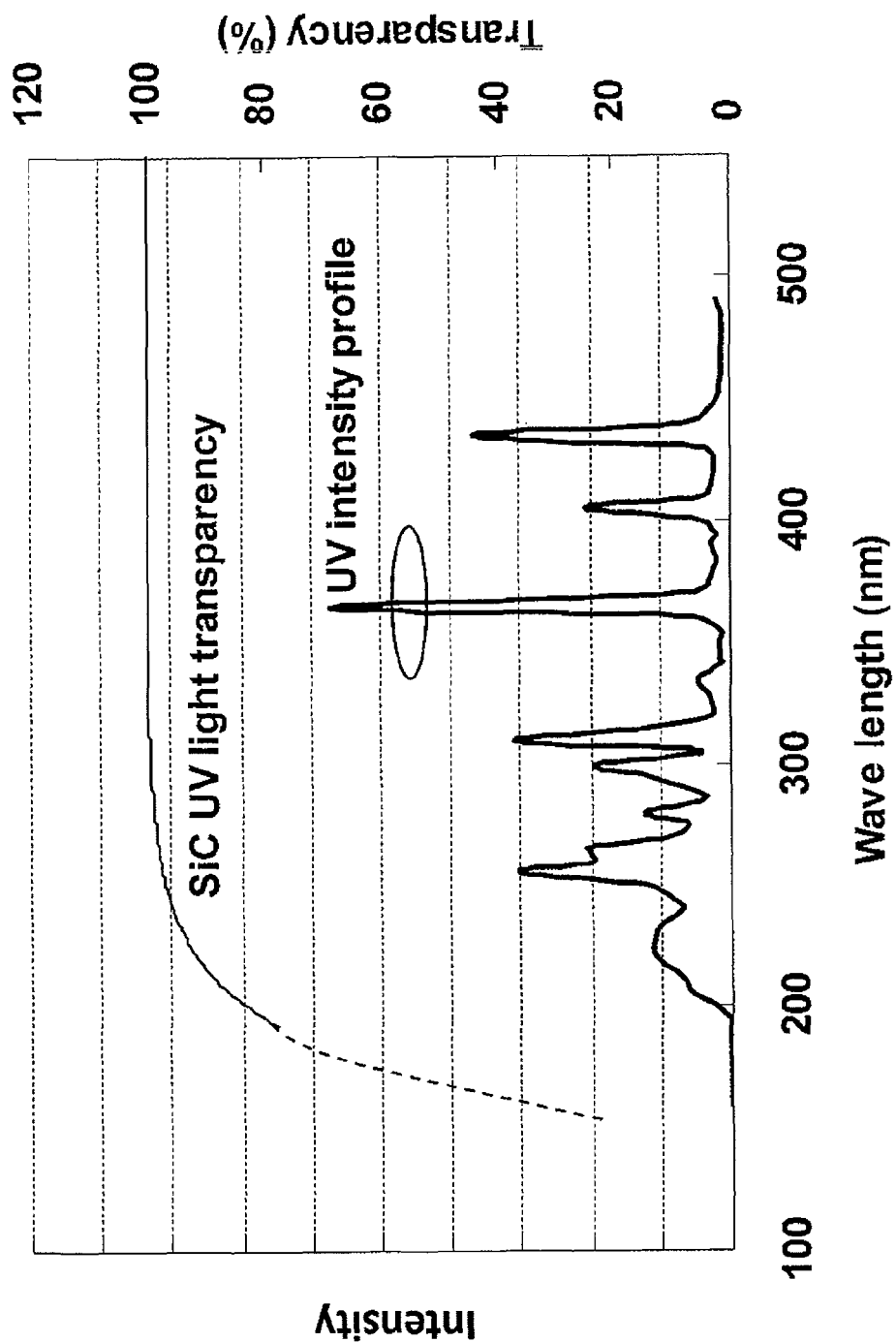
FIG. 6 is a graph showing the relationship between wave length and UV intensity/UV transparency of a SiC film according to an embodiment of the present invention.
Figure 7:
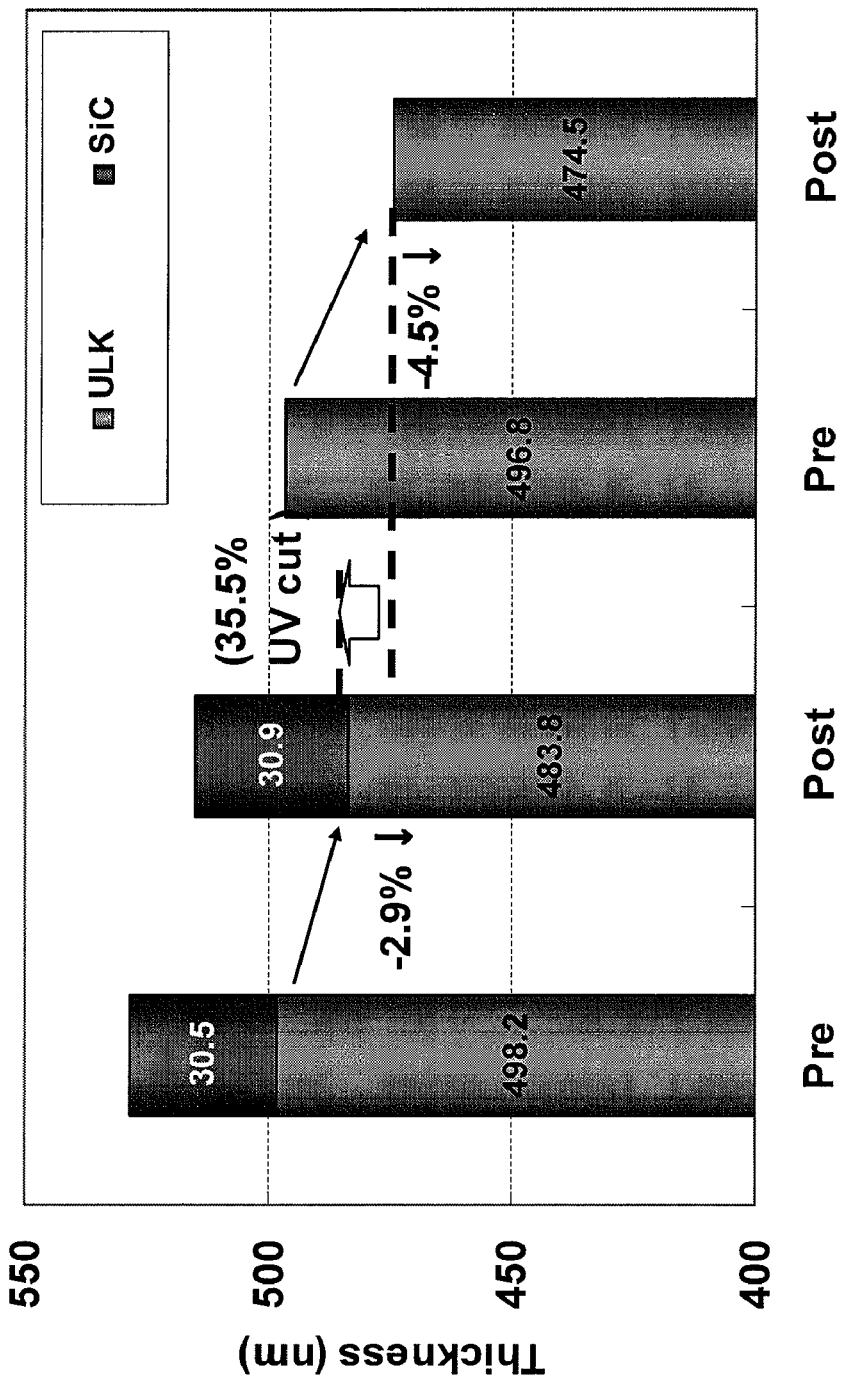
FIG. 7 is a graph showing thickness changes with/without a SiC cap according to an embodiment of the present invention.

Examples of how UV light with a wavelength of 200 to 250 nm would effectively improve film quality are shown in FIG. 6 and FIG. 7. Here, change in film quality is evaluated by reduction in film thickness. FIG. 6 shows the wavelength distribution of a high-pressure mercury lamp and the UV transmittance through a SiC film (CVD, 4MS=150 sccm, NH3=1,000 sccm, He=500 sccm, Pressure=500 Pa, RF (27 MHz)=500 W, RF (400 kHz)=150 W, Depo temperature=400° C., Film thickness=50 nm). The UV light transmittance through the SiC film was calculated from the extinction coefficient measured by ellipsometry and the film thickness. The SiC film is not sensitive to light with a wavelength of 300 nm or longer and transmits such light almost 100%. On the other hand, it absorbs light with a wavelength shorter than 300 nm, and this tendency is prominent with a light whose wavelength is 250 nm or shorter. With this mercury lamp, wavelengths shorter than 200 nm are not significant. Accordingly, if this mercury lamp is used to irradiate UV light onto a SiC film formed as a cap layer for a low-k film, the result would be the same as irradiating a low-k film with UV light with a wavelength of 200 to 250 nm.

FIG. 7 shows the result of how much a low-k film (CVD, TMDOS (tetra-methyl-disiloxane)=100 sccm, Isopropyl alcohol=400 sccm, O2=50 sccm, He=150 sccm, Pressure=800 Pa, RF (27 MHz)=1,800 W, Temperature=400° C., Film thickness=500 nm) would shrink when irradiated with UV light directly and over a SiC film. Under UV irradiation over the same duration, the film without SiC shrank more than the film with SiC. This is because UV light having the effect of shrinking low-k films was shielded by SiC. As shown in FIG. 6, light not transmitting through SiC had a wavelength shorter than 300 nm (notably 250 nm or shorter). This indicates that UV light having the effect of shrinking low-K films has a wavelength shorter than 300 nm. In this experiment, UV curing effect was reduced by 35% by the SiC film. Since UV light shielded to this extent mainly has a wavelength of 250 nm or shorter, it can be concluded that light with a wavelength of 250 nm or shorter is especially useful for UV curing.

These results find that to enhance the curing efficiency of low-k films, it is effective to increase the quantity of UV light with a wavelength of 250 nm or shorter. However, an attempt to increase the input power with the aim of increasing UV light with a wavelength of 300 nm or shorter, or preferably 250 nm or shorter, will lead to a proportional increase in light of other wavelengths, and more problematically heat generation. Increased heat generation pushes up the temperature of the cured substrate, which is a problem when curing interlayer insulation films where the temperature must be controlled at 400° C. or below. Accordingly, effective means for obtaining a greater quantity of UV light with a wavelength of 250 nm or shorter include: 1) cutting off the heat generated by the UV lamp and increasing the power input to the lamp, and 2) replacing the atmosphere around the lamp with nitrogen to reduce absorption of UV light by oxygen. The water-cooled filter used in an embodiment satisfies both of these conditions.

As explained above, embodiments of the present invention establish a method to improve the curing efficiency by specifying wavelengths of UV light effective in curing low-k films, resolving the heat problem of high-pressure mercury lamps with the use of a water-cooled filter, and also replacing the curing atmosphere with nitrogen to suppress ozone generation, consequently increasing the quantity of UV light effective for curing.

In the present disclosure where conditions and/or structures are not specified, the skilled artisan in the art can readily provide such conditions and/or structures, in view of the present disclosure, as a matter of routine experimentation.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A UV light irradiating apparatus for irradiating a semiconductor substrate with UV light, comprising:
    a reactor in which a substrate-supporting table is provided, said reactor being provided with a light transmission window;
    a UV light irradiation unit connected to the reactor for irradiating a semiconductor substrate placed on the substrate-supporting table with UV light through the light transmission window, said UV light irradiation unit including at least one UV lamp; and
    a liquid layer-forming channel disposed between the light transmission window and the UV lamp for forming a liquid layer through which the UV light is transmitted, said liquid layer being formed by a liquid flowing through the liquid layer-forming channel, wherein the liquid layer-forming channel is formed by a double walled enclosure that comprises an inner wall and an outer wall for passing the liquid between the walls, said inner wall being spaced from the at least one UV lamp by a space which allows gas to flow therethrough, wherein each of the space, the inner wall, the liquid layer, and the outer wall encloses and fully encircles the at least one UV lamp, and the liquid layer-forming channel is configured to form a planar liquid layer between the at least one UV lamp and the substrate-supporting table, said planar liquid layer being disposed substantially in parallel to the substrate-supporting table.

2. The UV light irradiating apparatus according to claim 1, wherein the liquid layer is formed by the flowing liquid which has substantially or nearly no absorption of UV light having a wavelength of 250 nm or lower.

3. The UV light irradiating apparatus according to claim 2, wherein the liquid constituting the liquid layer is pure water or ion-exchanged water.

4. The UV light irradiating apparatus according to claim 1, wherein the liquid layer-forming channel is formed with a glass capable of transmitting UV light having a wavelength of 250 nm or lower.

5. The UV light irradiating apparatus according to claim 1, wherein the liquid layer-forming channel is formed by two transparent walls for passing the liquid therebetween.

6. The UV light irradiating apparatus according to claim 5, wherein a distance between the two walls is about 5 mm to 15 mm.

7. The UV light irradiating apparatus according to claim 1, wherein the UV lamp has an elongated shape.

8. The UV light irradiating apparatus according to claim 1, wherein the double walled enclosure has a liquid inlet port for introducing the liquid between the inner and outer walls and a liquid outlet port for discharging the liquid from between the inner and outer walls.

9. The UV light irradiating apparatus according to claim 1, where the double walled enclosure has an inert gas inlet port for introducing inert gas into an interior enclosed by the inner wall and an inert gas outlet port for discharging the inert gas from the interior.

10. The UV light irradiation apparatus according to claim 1, wherein the liquid layer-forming channel is disposed in parallel to and closer to the UV light transmission window than to the UV lamp.

11. The UV light irradiating apparatus according to claim 1, wherein the UV light transmission window constitutes the liquid layer-forming channel.

12. The UV light irradiating apparatus according to claim 1, wherein the UV irradiation unit is provided with a reflection plate disposed along an inner wall of the UV irradiation unit, said reflection plate being angled to reflect UV light from the UV lamp toward the UV light transmission window.

13. The UV light irradiating apparatus according to claim 1, wherein the liquid layer-forming channel has a liquid inlet port for introducing the liquid into the channel and a liquid outlet port for discharging the liquid from the channel and is provided with a temperature sensor disposed at the liquid outlet port for detecting a temperature of the liquid at the liquid outlet port.

14. The UV light irradiating apparatus according to claim 13, wherein the liquid layer-forming channel is provided with a flow controller disposed upstream of the liquid inlet port for controlling the liquid flow according to the temperature detected by the temperature sensor.

* * * * *